(12) United States Patent
Park et al.

(10) Patent No.: US 9,762,201 B2
(45) Date of Patent: Sep. 12, 2017

(54) COMMON MODE FILTER AND MANUFACTURING METHOD THEREOF

(71) Applicant: SAMSUNG ELECTRO-MECHANICS CO., LTD., Suwon-Si, Gyeonggi-Do (KR)

(72) Inventors: Seung-Wook Park, Suwon-Si (KR); Won-Chul Sim, Suwon-Si (KR); Hong-Ryul Lee, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 122 days.

(21) Appl. No.: 14/716,849

(22) Filed: May 19, 2015

(65) Prior Publication Data

US 2015/0333722 A1 Nov. 19, 2015

(30) Foreign Application Priority Data

May 19, 2014 (KR) .................. 10-2014-0059857

(51) Int. Cl.
| | |
|---|---|
| H03H 7/01 | (2006.01) |
| H03H 7/42 | (2006.01) |
| H01F 27/28 | (2006.01) |
| H01F 27/245 | (2006.01) |
| H01F 41/02 | (2006.01) |
| H01F 41/04 | (2006.01) |
| H03H 3/013 | (2006.01) |
| H01F 17/00 | (2006.01) |
| H03H 1/00 | (2006.01) |

(52) U.S. Cl.
CPC ......... *H03H 7/427* (2013.01); *H01F 17/0013* (2013.01); *H01F 27/245* (2013.01); *H01F 27/2804* (2013.01); *H01F 41/0206* (2013.01); *H01F 41/041* (2013.01); *H01F 41/046* (2013.01); *H03H 3/013* (2013.01); *H03H 7/17* (2013.01); *H01F 2017/0066* (2013.01); *H01F 2017/0093* (2013.01); *H03H 2001/0057* (2013.01); *H03H 2001/0085* (2013.01); *Y10T 156/10* (2015.01)

(58) Field of Classification Search
CPC ................ H03H 7/0138; H03H 7/427; H03H 2001/0085; H01F 27/2804; H01F 27/245; H01F 41/0206; H01F 41/041
USPC ........................................ 333/185
See application file for complete search history.

(56) References Cited

U.S. PATENT DOCUMENTS

| | | | | |
|---|---|---|---|---|
| 6,373,674 B1 * | 4/2002 | Sugiura | .................. | H04B 15/02 333/17.1 |
| 7,790,503 B2 * | 9/2010 | Lin | ..................... | H01L 21/4857 257/E21.499 |

(Continued)

*Primary Examiner* — Stephen E Jones
*Assistant Examiner* — Rakesh Patel
(74) *Attorney, Agent, or Firm* — NSIP Law (57) ABSTRACT

Disclosed are a common mode filter and a manufacturing method thereof. The common mode filter in accordance with an aspect of the present invention includes: a substrate; a filter layer including a coil and a dielectric layer and disposed on the substrate and configured to remove a signal noise; and a magnetic layer being laminated on the filter layer, and a surface of the filter layer being joined with the magnetic layer can be formed to be flat by having the coil embedded in a surface of the filter layer being joined with the magnetic layer in such a way that one surface of the coil is exposed.

6 Claims, 5 Drawing Sheets

(56) References Cited

U.S. PATENT DOCUMENTS

| | | | |
|---|---|---|---|
| 7,911,295 B2* | 3/2011 | Inuzuka | H01F 17/0013 333/185 |
| 2008/0197963 A1* | 8/2008 | Muto | H01F 17/0013 336/200 |
| 2008/0227008 A1* | 9/2008 | Kami | G03G 5/0546 430/66 |
| 2009/0284340 A1* | 11/2009 | Nishikawa | H01F 17/0013 336/200 |

* cited by examiner

COMMON MODE FILTER AND MANUFACTURING METHOD THEREOF

CROSS-REFERENCE TO RELATED APPLICATIONS

This application claims the benefit of Korean Patent Application No. 10-2014-0059857, filed with the Korean Intellectual Property Office on May 19, 2014, the disclosure of which is incorporated herein by reference in its entirety.

BACKGROUND

1. Technical Field

The present invention relates to a common mode filter and a method of manufacturing the common mode filter.

2. Background Art

With the recent technological advancement, a growing number of electronic devices, such as mobile phones, home electronic appliances, PCs. PDAs and LCDs, have been changed from analog systems to digital systems. Moreover, owing to the increased amount of processed data, the electronic devices are required to be faster.

As the electronic devices are digitized and become faster, the electronic devices can be increasingly sensitive to irritation from outside. That is, any small abnormal voltage or high-frequency noise brought into the internal circuitry of an electronic device from the outside can cause a damage to the circuitry or a signal distortion.

Sources of the abnormal voltage and noise that cause the circuitry damage or signal distortion of the electronic device include lightning, discharging of static electricity that has been charged in human body, switching voltage generated in the circuitry, power noise included in the electric source voltage, unnecessary electromagnetic signal or electromagnetic noise, etc.

In order to prevent the circuitry damage or signal distortion of the electronic device, a filter needs to be installed to prevent the abnormal voltage and high-frequency noise from being brought into the circuitry. Particularly, a common mode filter is often installed in, for example, a high-speed differential signal line in order to remove common mode noise.

The related art of the present invention is disclosed in Korea Patent Publication No. 10-2012-0033644 (laid open on Apr. 9, 2012).

SUMMARY

Some embodiments of the present invention provide a common mode filter and a manufacturing method thereof that can laminate a magnetic layer on a filter layer effectively without losing magnetic flux of a coil.

An aspect of the present invention provides a common mode filter, which includes: a substrate; a filter layer including a coil and a dielectric layer and disposed on the substrate and configured to remove a signal noise; and a magnetic layer being laminated on the filter layer. Here, a surface of the filter layer being joined with the magnetic layer can be formed to be flat by having the coil embedded in a surface of the filter layer being joined with the magnetic layer in such a way that one surface of the coil is exposed.

The filter layer can be formed by forming the coil on one surface of a core and then laminating the dielectric layer on the one surface of the core so as to cover the coil, and the magnetic layer can be joined to a surface of the filter layer from which the core is removed.

The magnetic layer can be made of a composite material sheet containing a magnetic substance.

The coil can be embedded to be depressed into the dielectric layer from a surface of the dielectric layer that is joined by the magnetic layer.

Another aspect of the present invention provides a method of manufacturing a common mode filter that includes: forming a coil on one surface of a core; forming a filter layer by laminating a dielectric layer on one surface of the core so as to cover the coil; removing the core from the filter layer; and laminating a magnetic layer on a surface of the filter layer from which the core is removed, and joining a substrate on an opposite surface thereof.

The magnetic layer can be made of a composite material sheet containing a magnetic substance.

DETAILED DESCRIPTION

Hereinafter, certain embodiments of a common mode filter and a manufacturing method thereof in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

Figure 1:
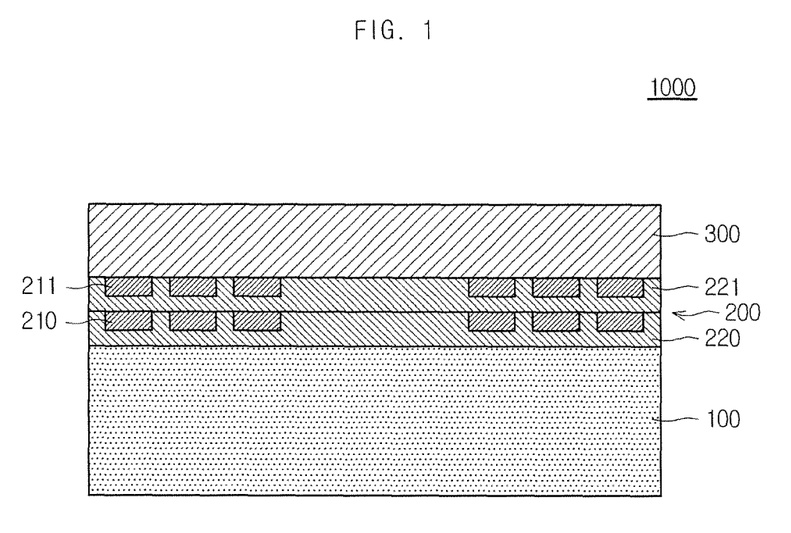
FIG. 1 is a brief illustration of a common mode filter in accordance with an embodiment of the present invention.
Figure 8:
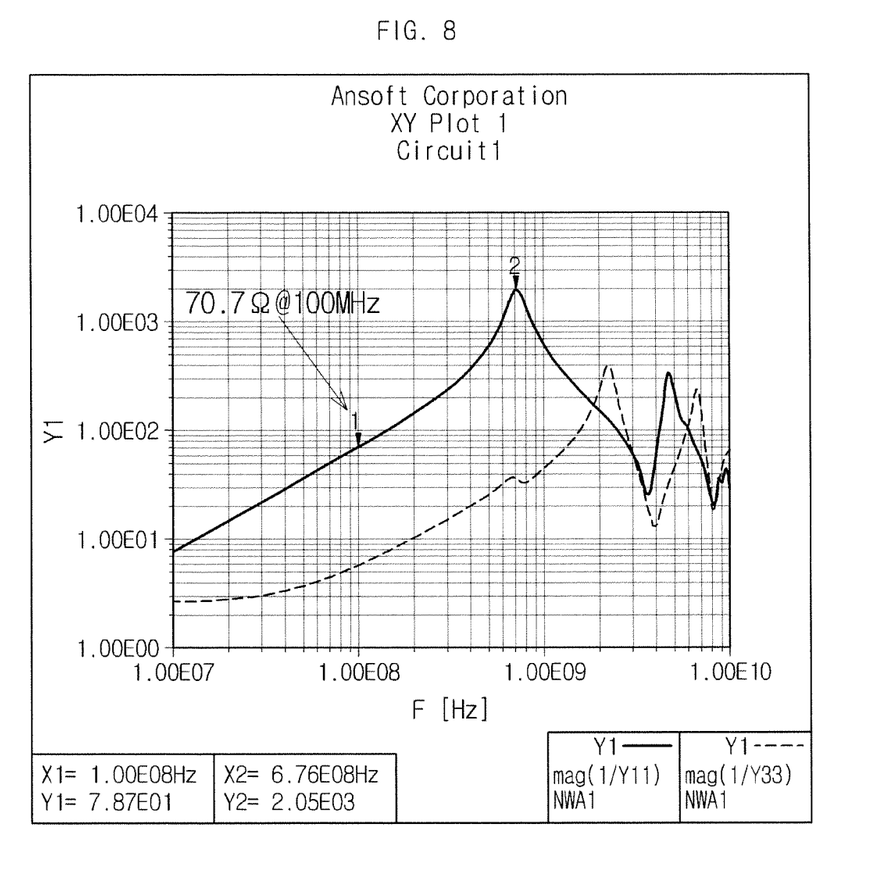
FIG. 8 and FIG. 9 show test results for the common mode filter in accordance with an embodiment of the present invention.
Figure 9:
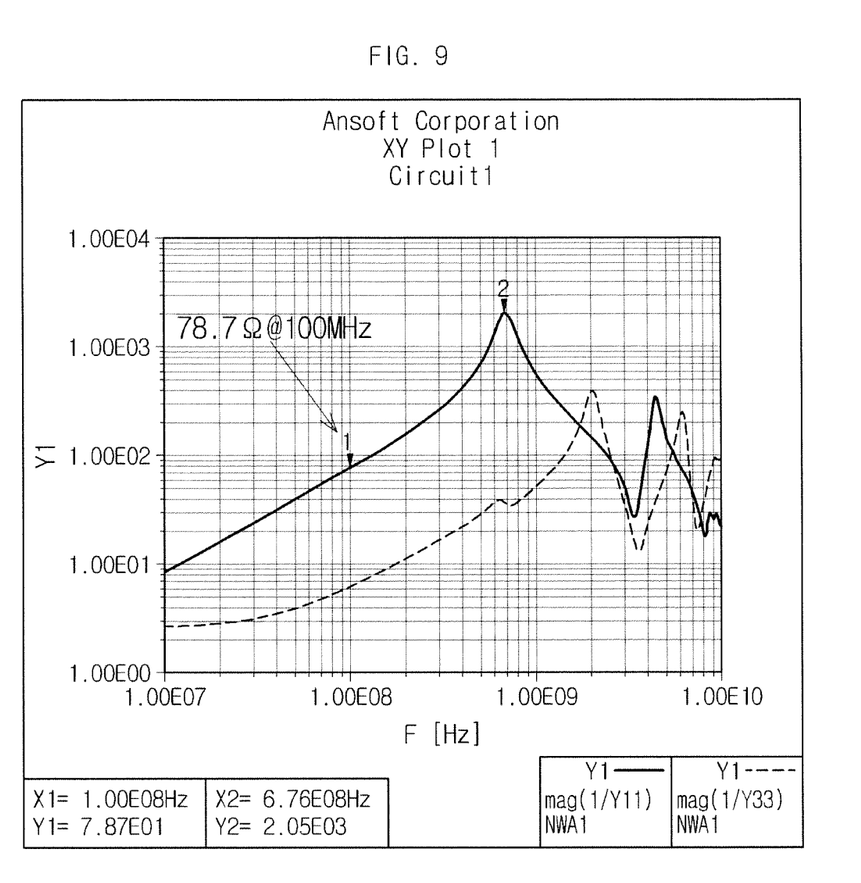

FIG. 1 is a brief illustration of a common mode filter in accordance with an embodiment of the present invention. FIG. 8 and FIG. 9 show test results for the common mode filter in accordance with an embodiment of the present invention.

As illustrated in FIG. 1, a common mode filter 1000 in accordance with an embodiment of the present invention includes a substrate 100, a filter layer 200 and a magnetic layer 300.

The substrate 100, which is a portion that supports the filter layer 200, can form a magnetic field with the magnetic layer 300. In such a case, the substrate 100 functions to support the filter layer 200 and can be disposed at a lower portion of the common mode filter 1000 in accordance with the present invention.

Here, the substrate 100 can include a magnetic material and function as a closed magnetic circuit. For instance, the substrate 100 can include sintered ferrite or a ceramic material such as forsterite. The substrate 100 can be formed with a predetermined area or thickness according to the shape of the common mode filter 1000.

The filter layer 200 includes coils 210, 211 and dielectric layers 220, 221 and disposed on the substrate 100 to remove signal noises. As illustrated in FIG. 1, the filter layer 200 can include a plurality of laminated dielectric layers 220, 221 and a plurality of coils 210, 211.

Specifically, the filter layer 200 can include the plurality of dielectric layers 220, 221 that are successively laminated on an upper surface of the substrate 100 and the plurality of coils 210, 211 that are interposed in between the dielectric layers 220, 221. In such a case, the dielectric layers 220, 221 can be made of different materials from one another, if necessary.

Meanwhile, the filter layer 200 can be electrically connected with an external terminal formed on a lateral surface or an upper surface of the common mode filter 1000 in accordance with the present embodiment.

The magnetic layer 300 is laminated on the filter layer 200 and can form a magnetic field with the substrate 100. Moreover, together with the substrate 100, the magnetic layer 300 can protect the filter layer 200. The magnetic layer 300 can constitute a mounting surface or a lower surface of the common mode filter 1000 in accordance with the present embodiment. In case a cavity is formed at a portion of the filter layer 200, the magnetic layer 300 can be laminated on the filter layer 200 while filling in the cavity.

In such a case, the coil 211 can be embedded in the filter layer 200 in such a way that one surface of the coil 211 is exposed on a surface of the filter layer 200 that joins the magnetic layer 300, so that the surface of the filter layer 200 that joins the magnetic layer 300 can be formed to be flat. That is, on an upper-most surface of the filter layer 200 shown in FIG. 1, the dielectric layer 221 and the one surface of the coil 211 embedded therein can be formed to be flat and join the magnetic layer 300.

If the upper-most surface of the filter layer 200 were not flat, adhesion with the magnetic layer 300 might be weakened, or interfacial debonding might occur. Moreover, in order to supplement the unflat filter layer 200, an additional layer may need to be interposed between the filter layer 200 and the magnetic layer 300.

Therefore, in the common mode filter 1000 in accordance with the present embodiment, the surface of the filter layer 200 that joins the magnetic layer 300 is formed to be flat, making it possible to laminate the magnetic layer 300 on the filter layer 200 more readily.

Accordingly, the common mode filter 1000 can be manufactured more readily, and it is possible to prevent any property deterioration caused by, for example, interfacial debonding.

Meanwhile, as illustrated in FIG. 8 and FIG. 9, it can be seen that impedance values of the common mode filter 1000 in accordance with the present embodiment are increased. Here, FIG. 8 shows impedance values when a coil is fully embedded in a dielectric layer, without having one surface of the coil exposed, and FIG. 9 shows impedance values when one surface of the coil 211 is exposed and the magnetic layer 300 joins the coil 211 directly, like the common mode filter 1000 in accordance with the present embodiment.

Such an increase in impedance value of the common mode filter 1000 in accordance with the present embodiment is resulted from getting the loss of magnetic flux of the coil 211 minimized as the magnetic layer 300 and the coil 211 are joined directly, providing advantages in structural design, for example, by improving impedance efficiency.

As such, in the common mode filter 1000 in accordance with the present embodiment, the filter layer 200 has the coil embedded therein in such a way that one surface of the coil 211 is exposed on the surface of the filter layer 200 that joins the magnetic layer 300, and the surface of the filter layer 200 that joins the magnetic layer 300 is formed to be flat. Therefore, the magnetic layer 300 can be effectively laminated on the filter layer 200 without any loss of magnetic flux of the coil 211.

In the common mode filter 1000 in accordance with the present embodiment, the filter layer 200 can be formed by forming the coil 211 on one surface of a core 10 (see FIG. 4) and then laminating the dielectric layer 221 on the one surface of the core 10 so as to cover the coil 211, and the magnetic layer 300 can be joined to a surface of the filter layer 200 from which the core 10 is removed.

Figure 4:
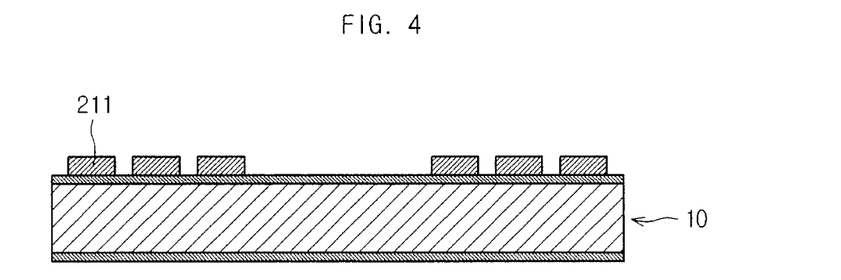
FIG. 4, FIG. 5, FIG. 6 and FIG. 7 show major steps of the method of manufacturing a common mode filter in accordance with an embodiment of the present invention.

Specifically, in the case where the coil 211 is formed on the one surface of the core 10 and the dielectric layer 221 is laminated on the one surface of the core 10 so as to cover the coil 211, a uniform flatness of the surface of the filter layer 200 that joins the one surface of the core 10 can be provided according to a flatness of the one surface of the core 10.

Therefore, by removing the core 10 from and joining the magnetic layer 300 to the surface of the filter layer 200 having the uniform flatness, the surface where the filter layer 200 and the magnetic layer 300 are joined with each other can be formed to be flat. Accordingly, the one surface of the coil 211 can be exposed on the surface where the filter layer 200 and the magnetic layer 300 are joined with each other.

As such, in the common mode filter 1000 in accordance with the present embodiment, the one surface of the coil 211 can be exposed more effectively on the surface where the filter layer 200 and the magnetic layer 300 are joined with each other by use of the core 10, and at the same time the surface where the filter layer 200 and the magnetic layer 300 are joined with each other can be formed to be flat.

Meanwhile, in the common mode filter 1000 in accordance with the present embodiment, if the magnetic layer 300 is made of a composite material sheet containing a magnetic substance, the common mode filter 1000 can be manufactured more effectively. For example, the magnetic layer 300 can be in the form of a sheet structure made of epoxy resin containing ferrite powder.

That is, by forming the surface where the filter layer 200 and the magnetic layer 300 are joined with each other to be flat, as described above, the composite material sheet can be attached to an upper surface of the filter layer 200 more easily.

Therefore, the common mode filter 1000 in accordance with the present embodiment can be manufactured more readily because the magnetic layer 300 can be sufficiently formed by attaching the composite material sheet to the upper surface of the filter layer 200, without a complicated process of coating or filling in the magnetic layer 300 to the filter layer 200.

Meanwhile, the magnetic layer 300 can be substituted with the dielectric layer 220, 221 or formed with a paste, if necessary.

Figure 2:
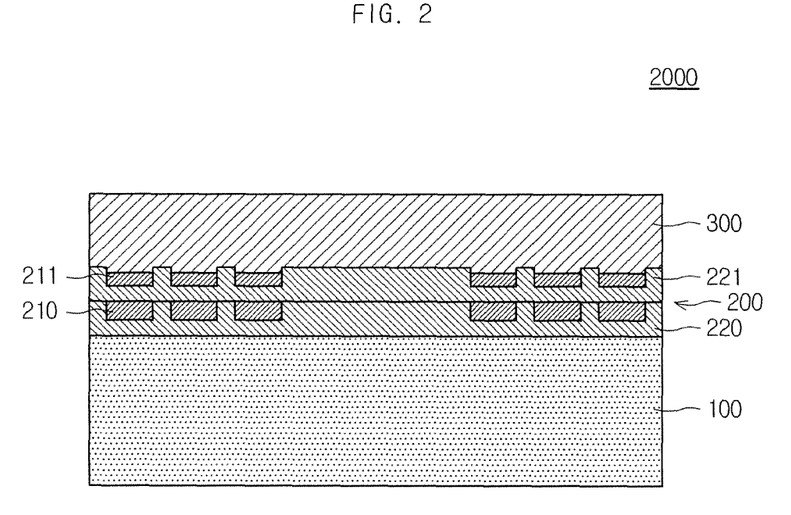
FIG. 2 is a brief illustration of a common mode filter in accordance with another embodiment of the present invention.

FIG. 2 is a brief illustration of a common mode filter in accordance with another embodiment of the present invention.

As illustrated in FIG. 2, in a common mode filter 2000 in accordance with another embodiment of the present invention, a coil 211 can be embedded to be depressed into a dielectric layer 221 from a surface of the dielectric layer 221 that is joined by a magnetic layer 300.

Specifically, based on a direction shown in FIG. 2, an upper-most surface of the coil 211 can be formed to be lower than an upper-most surface of the dielectric layer 221. In such a case, the upper-most surface of the coil 211 can be formed to be lower than the upper-most layer of the dielectric layer 221 through a separate process, such as etching.

As a result, in the common mode filter 2000 in accordance with the present embodiment, a portion of the magnetic layer 300 can be brought into and anchored to the dielectric layer 221, and thus the coil 211 and the dielectric layer 211 can be attached to the magnetic layer 300 more tightly, thereby further improving the reliability of the common mode filter 2000 and increasing an impedance value because of direct joining of the magnetic layer 300 and the coil 211 with each other.

Moreover, if necessary, the coil 211 can be embedded in the dielectric layer 221 in such a way that the coil 211 is protruded outwardly from the surface of the dielectric layer 221 that is joined by the magnetic layer 300, in order to attach the coil 211 and the dielectric layer 221 to the magnetic layer 300 sufficiently. In other words, the upper-most surface of the coil 211 can be formed to be higher than the upper-most surface of the dielectric layer 221.

Most elements and configurations of the common mode filter 2000 in accordance with another embodiment of the present invention are identical or similar to those of the common mode filter 1000 in accordance with an embodiment of the present invention, and thus any redundant description will not be provided herein.

Figure 3:
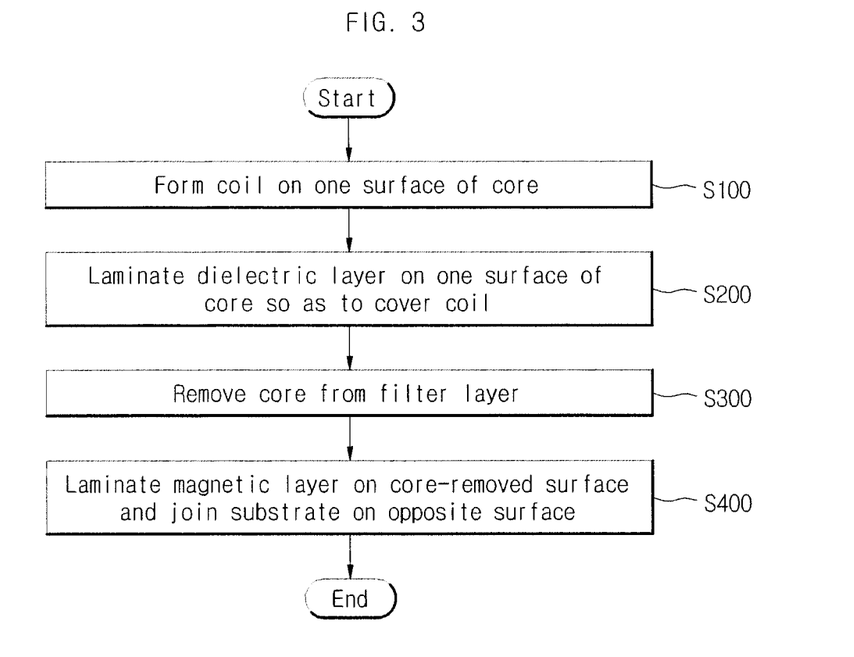
FIG. 3 is a flow diagram showing a method of manufacturing a common mode filter in accordance with an embodiment of the present invention.

FIG. 3 is a flow diagram showing a method of manufacturing a common mode filter in accordance with an embodiment of the present invention. FIG. 4, FIG. 5, FIG. 6 and FIG. 7 show major steps of the method of manufacturing a common mode filter in accordance with an embodiment of the present invention.

As illustrated in FIG. 3 to FIG. 7, the method of manufacturing a common mode filter in accordance with an embodiment of the present invention starts with forming a coil 211 on one surface of a core 10 (S100 and FIG. 4).

Here, the coil 211 can be formed by, for example, plating a conductive layer on the core 10 and pattering the conductive layer.

Figure 5:
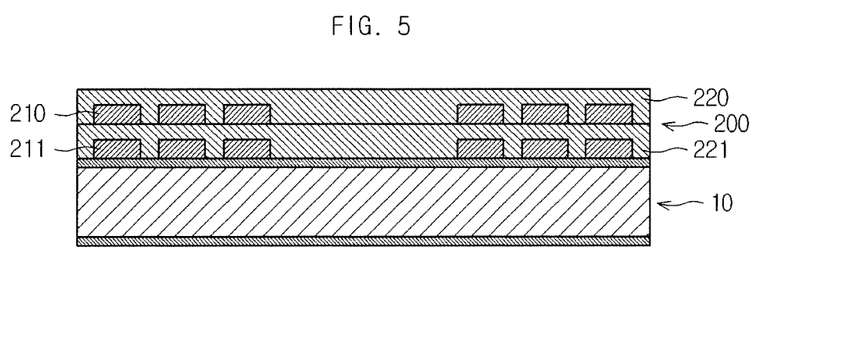

Next, a filter layer 200 can be formed by laminating a dielectric layer 221 on one surface of the core 10 so as to cover the coil 211 (S200 and FIG. 5). Here, the filter layer 200 can include a plurality of dielectric layers 220, 221, which are successively laminated on the one surface of the core 10, and a plurality of coils 210, 211, which are interposed between the dielectric layers 220, 221.

Figure 6:
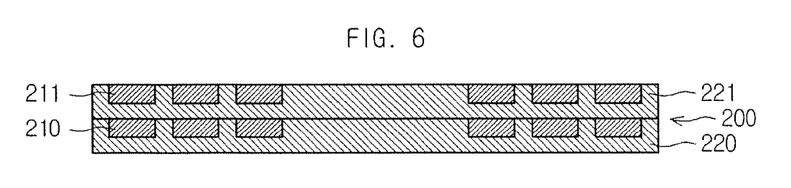

Then, the core 10 can be removed from the filter layer 200 (S300 and FIG. 6). Here, the core 10 can be removed from the filter layer 200 through, for example, a routing process. Accordingly, one surface of the coil 211 can be exposed on a surface where the filter layer 200 and a magnetic layer 300 are joined with each other.

Figure 7:
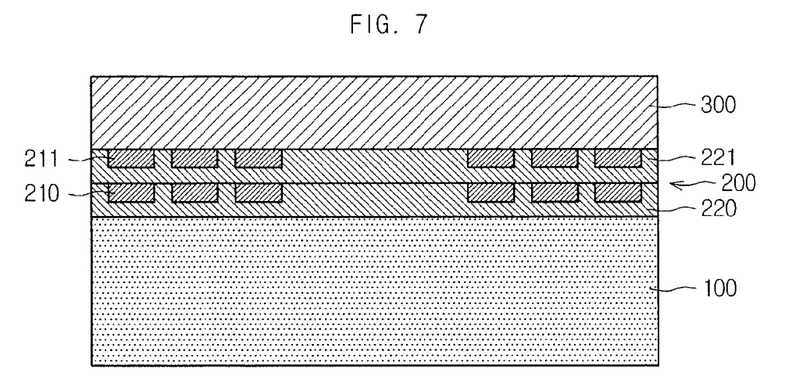

Thereafter, the magnetic layer 300 can be laminated on a surface of the filter layer 200 from which the core 10 is removed, and a substrate 100 can be joined on an opposite surface thereof (S400 and FIG. 7). Here, according to flatness of the one surface of the core 10, a uniform flatness of the surface of the filter layer 200 that was joined with the one surface of the core 10 can be provided.

Therefore, by removing the core 10 from and joining the magnetic layer 300 to the surface of the filter layer 200 having the uniform flatness, the surface where the filter layer 200 and the magnetic layer 300 are joined with each other can be formed to be flat.

As such, in the method of manufacturing a common mode filter in accordance with the present embodiment, the one surface of the coil 211 can be exposed more effectively on the surface where the filter layer 200 and the magnetic layer 300 are joined with each other by use of the core 10, and at the same time the surface where the filter layer 200 and the magnetic layer 300 are joined with each other can be formed to be flat.

Meanwhile, in the method of manufacturing a common mode filter in accordance with the present embodiment, if the magnetic layer 300 is made of a composite material sheet containing a magnetic substance, the common mode filter can be manufactured more effectively.

That is, by forming the surface where the filter layer 200 and the magnetic layer 300 are joined with each other to be flat, as described above, the composite material sheet can be attached to an upper surface of the filter layer 200 more easily.

Therefore, in the method of manufacturing a common mode filter in accordance with the present embodiment, the common mode filter can be manufactured more readily because the magnetic layer 300 can be sufficiently formed by attaching the composite material sheet to the upper surface of the filter layer 200, without a complicated process of coating or filling in the magnetic layer 300 to the filter layer 200.

Here, the coil 211 can be embedded to be depressed into the dielectric layer 221 from a surface of the dielectric layer 221 that is joined by the magnetic layer 300.

Specifically, based on a direction shown in FIG. 2, an upper-most surface of the coil 211 can be formed to be lower than an upper-most surface of the dielectric layer 221. In such a case, the upper-most surface of the coil 211 can be formed to be lower than the upper-most layer of the dielectric layer 221 through a separate process, such as etching.

As a result, in the method of manufacturing a common mode filter in accordance with the present embodiment, a portion of the magnetic layer 300 can be brought into and anchored to the dielectric layer 221, and thus the coil 211 and the dielectric layer 211 can be attached to the magnetic layer 300 more tightly, thereby further improving the reliability of the common mode filter and increasing an impedance value because of direct joining of the magnetic layer 300 and the coil 211 with each other.

Moreover, if necessary, the coil 211 can be embedded in the dielectric layer 221 in such a way that the coil 211 is protruded outwardly from the surface of the dielectric layer 221 that is joined by the magnetic layer 300, in order to attach the coil 211 and the dielectric layer 221 to the magnetic layer 300 sufficiently. In other words, the upper-most surface of the coil 211 can be formed to be higher than the upper-most surface of the dielectric layer 221.

Most elements and configurations of the method of manufacturing a common mode filter in accordance with an embodiment of the present invention are identical or similar to those of the common mode filter 1000 in accordance with an embodiment of the present invention or the common mode filter 2000 in accordance with another embodiment of the present invention, and thus any redundant description will not be provided herein.

Although certain embodiments of the present invention have been described, it shall be appreciated that there can be a very large number of permutations and modification of the present invention by those who are ordinarily skilled in the art to which the present invention pertains without departing from the technical ideas and scope of the present invention, which shall be defined by the claims appended below.

It shall be also appreciated that many other embodiments than the embodiments described above are included in the claims of the present invention.

What is claimed is:

1. A common mode filter comprising:
   a substrate;
   a filter layer comprising a coil and a dielectric layer, the filter layer being disposed on the substrate and configured to remove a signal noise; and
   a magnetic layer laminated on a surface of the filter layer, wherein the coil is embedded in the surface of the filter layer on which the magnetic layer is laminated so that one surface of the coil is exposed, and
   wherein the exposed one surface of the coil is depressed below the surface of the filter layer on which the magnetic layer is laminated.

2. The common mode filter of claim 1, wherein both the filter layer and the exposed one surface of the coil are in contact with the magnetic layer.

3. The common mode filter of claim 1, wherein the magnetic layer is made of a composite material sheet containing a magnetic substance.

4. The common mode filter of claim 3, wherein the composite material sheet is composed of an epoxy resin and the magnetic substance is ferrite powder dispersed in the epoxy resin.

5. A method of manufacturing a common mode filter, the method comprising:
   forming a coil on one surface of a core;
   forming a filter layer by laminating a dielectric layer on the one surface of the core so that the dielectric layer covers the coil;
   removing the core from the filter layer;
   removing a portion of the coil exposed at a surface of the filter layer from which the core was removed so that an exposed surface of the coil is depressed below the surface of the filter layer from which the core was removed;
   laminating a magnetic layer on the surface of the filter layer from which the core was removed; and
   joining a substrate to a surface of the filter layer on an opposite side of the filter layer from the surface of the filter layer from which the core was removed.

6. The method of claim 5, wherein the magnetic layer is made of a composite material sheet containing a magnetic substance.

* * * * *